United States Patent [19]

Newlin

[11] Patent Number: 5,821,826
[45] Date of Patent: Oct. 13, 1998

[54] OSCILLATOR CIRCUIT SYNCHRONIZATION

[75] Inventor: Trevor Newlin, West Lothian, Scotland

[73] Assignee: Burr-Brown Corporation, Tucson, Ariz.

[21] Appl. No.: 664,402

[22] Filed: Jun. 17, 1996

[51] Int. Cl.⁶ ..................................................... H03B 5/36
[52] U.S. Cl. .................... 331/74; 331/75; 331/113 A; 363/15; 363/16
[58] Field of Search .................................. 331/74, 75, 76, 331/113 A, 113 S; 363/15, 16, 20, 21, 131

[56] References Cited

U.S. PATENT DOCUMENTS

| | | | |
|---|---|---|---|
| 3,047,816 | 7/1962 | Drake et al. | 331/49 |
| 3,049,675 | 8/1962 | Favin | 331/44 |
| 3,297,955 | 1/1967 | Corey et al. | 331/55 |
| 3,555,447 | 1/1971 | Bonfeld et al. | 331/55 |
| 3,651,427 | 3/1972 | Rolfes et al. | 331/153 |
| 4,310,804 | 1/1982 | Ryon | 331/1 A |
| 4,521,745 | 6/1985 | Falconer | 331/2 |
| 4,864,255 | 9/1989 | Yoshida | 331/75 |
| 4,939,423 | 7/1990 | Ruby | 315/105 |
| 5,059,926 | 10/1991 | Karczewski | 331/47 |
| 5,091,837 | 2/1992 | Duspiva et al. | 363/15 |
| 5,448,466 | 9/1995 | Erckert | 363/16 |
| 5,568,100 | 10/1996 | Locanthi | 331/74 |

*Primary Examiner*—Timothy P. Callahan
*Assistant Examiner*—An T. Luu
*Attorney, Agent, or Firm*—Schnader Harrison Segal & Lewis LLP

[57] ABSTRACT

An apparatus and method for generating signals. According to one embodiment, the apparatus has an oscillator generating a series of signals, an output stage for transforming the series of signals into a second series of signals, and a watchdog for providing a control signal to the output stage to hold the output stage in a selected state and for changing the control signal to enable the output stage in the selected state when the oscillator generates a first signal of the series of signals.

12 Claims, 9 Drawing Sheets

OSCILLATOR CIRCUIT SYNCHRONIZATION

BACKGROUND OF THE INVENTION

1. Field of the Invention

The present invention relates to oscillator circuits, and, in particular, to the synchronization of oscillator circuits used with DC—DC converters.

2. Description of the Related Art

This invention relates to the synchronization of oscillator circuits. Oscillator circuits are frequently used in DC—DC converters. Such converters are often used, for example, for providing isolated power supply to power devices such as isolated amplifiers. Isolated amplifiers serve to buffer signals, such as those that are transmitted over relatively long distances. To help provide for isolation, each isolated amplifier is driven by its own isolated power supply. This may be obtained by use of a DC—DC converter. Thus, a single DC power supply may drive a plurality of DC—DC converters, each of which provides an independent, isolated DC output that may be used as an isolated power supply for its respective isolation amplifier or other devices.

DC—DC converters typically utilize a transformer with a switching means on the primary winding, and a voltage rectifier coupled to the transformer's secondary winding. The switching means is controlled by an oscillator circuit. The oscillator circuit, switching means, and transformer may be considered to function as a DC-AC converter which is a component of the overall DC—DC converter, since the transformer's output is a square wave that approximates an AC voltage, or from which an AC voltage may be obtained.

To provide an isolated DC output voltage, a DC input voltage from an input DC power supply is applied via the switching means to the primary winding of the converter's transformer. The switching means switches the input voltage to the primary winding at a certain frequency, in accordance with a periodic signal supplied by an oscillator circuit connected to or incorporated in the switching means. A square wave output voltage at the oscillator circuit frequency is produced at the output of the secondary winding of the transformer. This square wave may be rectified to provide a regulated and isolated output DC voltage. The square wave may also be filtered to provide an isolated AC voltage, if desired. The switching means may comprise switching (or "drive") transistors controlled by the oscillator circuit's output signal. The combination of oscillator and switching circuit is sometimes referred to as a "chopper" or chopping device since it is used to "chop" the input voltage into an output square wave.

When multiple DC—DC converters are utilized and located near each other and/or are powered by the same DC power supply, various problems can arise. For example, if two adjacent DC—DC converters have oscillator circuits switching at 410 kHz and 390 kHz, respectively, a beat frequency formed by the difference of the two frequencies (20 kHz) may result which can introduce AC noise into the DC power supply and produce other undesirable effects. One solution to this beat frequency problem is to utilize decoupling capacitors on the DC power supply to filter any AC currents caused by this AC noise. However, such capacitors must be extremely large and do not always adequately address all the AC noise-related problems.

Another solution is to synchronize all the oscillator circuits of a plurality of DC—DC converters that would otherwise cause AC noise due to the oscillators operating at different frequencies. This may be done by tying a "sync" or synchronization pin of all the oscillators together, which forces the oscillators to transition simultaneously. When all the oscillators are synchronized, all of the DC—DC converters' respective primary transformer windings are switched or chopped simultaneously, thereby eliminating or reducing the aforementioned beat current problem. However, having many transformer windings switch simultaneously across the DC power supply can put high current demands on the DC power supply and can also cause noise to be introduced into the power supply. This noise is centered around a single synchronized frequency, however, and may thus be filtered out more effectively and efficiently with a dedicated filtering device than when the oscillators are unsynchronized.

Another problem associated with the use of normal oscillator circuits is that the periodic output signals they produce do not always provide an equal or 50:50 "mark:space" (i.e., "on:off") ratio. If the mark:space ratio is not 50:50 then a DC current can arise in the primary winding of the transformer, which can dramatically reduce its performance. Thus, a divide by two stage is frequently utilized on the output of the oscillator circuit to ensure a 50:50 mark:space ratio. If the oscillator outputs an 800 kHz periodic signal with an imperfect mark:space ratio, the divide by two stage outputs a 400 kHz periodic signal having a mark: space ratio of 50:50 or very close to 50:50.

Divide by two circuits have two stable states, "on" and "off"; however, the state in which a divide by two circuit will start in at power up is random and unpredictable, and therefore unsynchronized. Thus, when using multiple, synchronized oscillators, each having a divide by two output stage, the divide by two circuits themselves will not necessarily toggle together since some of them will start "on" and some will start "off," thus toggling inversely from one another. Oscillator/divide by two combinations that provide an output clock signal are thus difficult to synchronize, even if the oscillator portion can be synchronized, due to the unpredictable and thus unsynchronizable nature of the divide by two stage. This can change the radiated magnetic field patterns, causing problems in adjacent circuitry.

There is, therefore, a need for improved apparatuses and methods for synchronizing oscillator circuits.

SUMMARY

There is provided herein an apparatus and method for generating signals. According to one embodiment of the invention, the apparatus has an oscillator for generating a series of signals, an output stage for transforming the series of signals into a second series of signals, and a watchdog for providing a control signal to the output stage to hold the output stage in a selected state and for changing the control signal to enable the output stage in the selected state when the oscillator generates a first signal of the series of signals.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

Figure 1:
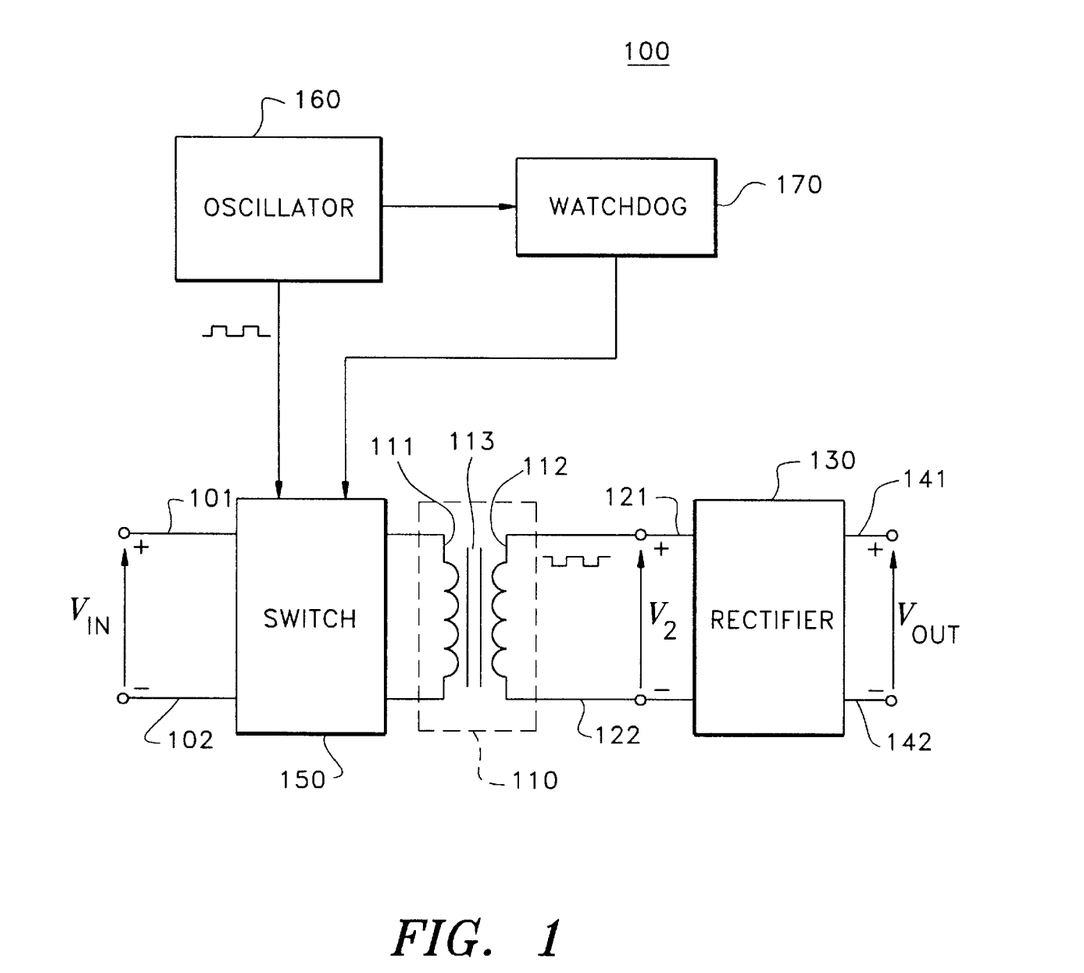
FIG. 1 is a DC—DC converter circuit according to a preferred embodiment of the present invention.

Referring now to FIG. 1, there is shown DC-AC converter circuit 100, according to a preferred embodiment of the present invention. In circuit 100, a transformer 110 is used, with switching means 150 and oscillator 160, to connect and disconnect an input voltage $V_{IN}$ at terminals 101, 102 to the primary winding 111 of transformer 110. Transformer 110 also comprises core 113 and secondary winding 112. Oscillator circuit 160 generates a suitable periodic signal of a selectable or predetermined frequency, such as a square wave, which is used to control switching means 150. In various suitable embodiments, switching means 150 may switch in response to every edge transition of the oscillator signal, in response only to every negative edge transition, in response to the absolute level (high or low) of the oscillator signal, and the like. In a preferred embodiment of the present invention, switching means 150 switches each time the oscillator signal provides a negative transition, i.e. from high to low.

Figure 2:
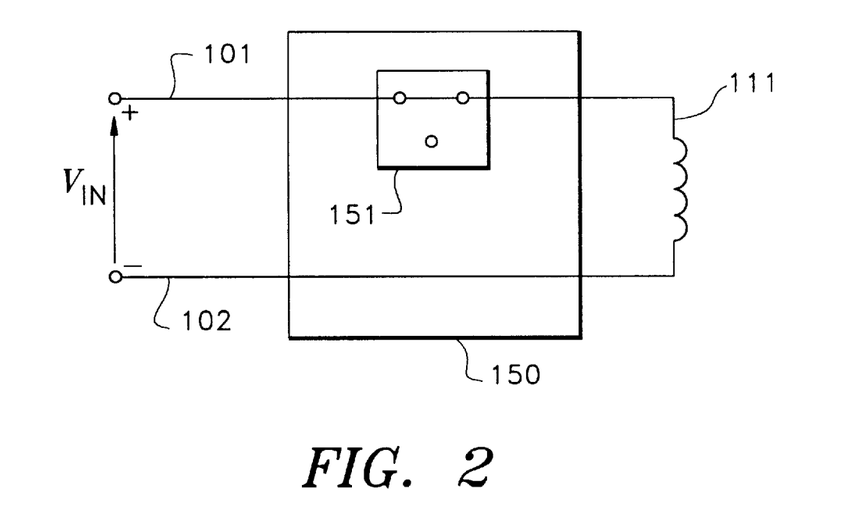
FIG. 2 is a more detailed view of the switching means of the circuit of FIG. 1.
Figure 3:
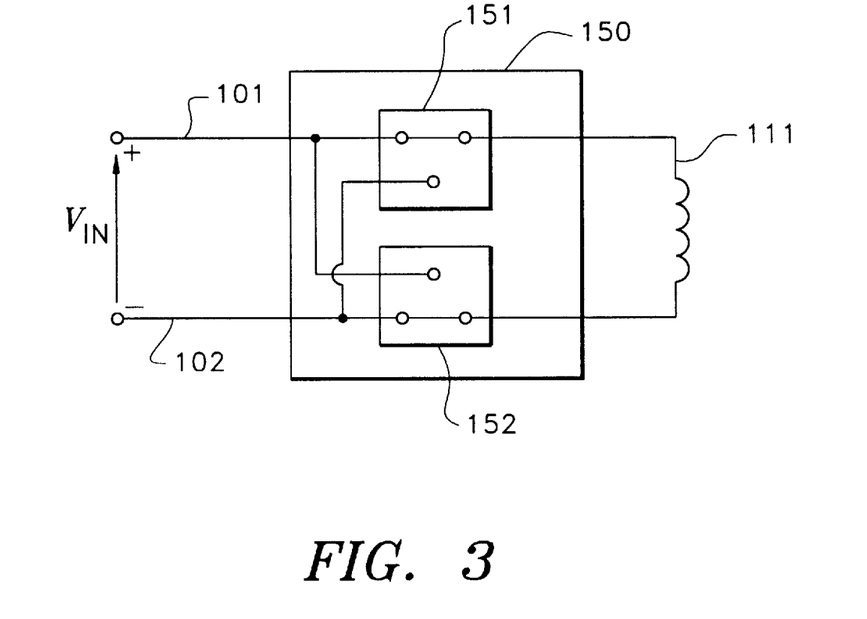
FIG. 3 is a more detailed view of an alternative switching means of the circuit of FIG. 1.

Oscillator circuit 160 may include a normal oscillator stage and a divide by two stage, or it may include only the normal oscillator stage. Oscillator circuit 160 may also have a "sync" pin that allows it to be tied to and thus synchronized with other oscillator circuits. Switching means 150 may toggle terminals 101 and 102 with switch 151, in one embodiment, to either connect $V_{IN}$ to winding 111 or to an open circuit connection, as illustrated in FIG. 2. As will be appreciated, in alternative embodiments switch 151 may be coupled in series with "low side" line 102, which may be ground coupled, instead of to line 101. Referring to FIG. 3, there is shown an alternative means of switching terminals 101 and 102, such that terminals 101 and 102 are alternately applied to opposite ends of primary winding 111 with switches 151 and 152, as illustrated. As will be appreciated, in alternative embodiments one terminal such as terminal 101 may be coupled to a center tap node of winding 111 and terminal 102 may be switched by a switching means back and forth from opposite ends of winding 111.

Oscillator 160 causes switch 150 to toggle back and forth at the oscillator frequency. Transformer 110 therefore outputs on secondary winding 112 voltage $V_2$, which has a square wave shape. As will be appreciated, the root-mean square (RMS) magnitude of $V_2$ may be equal to, greater, or less than the magnitude of $V_{IN}$, depending on the ratio of turns of windings 111 and 112, on the duty cycle of the signal generated by oscillator 160, and on the means of connecting and switching terminals 101 and 102 to primary winding 111. Voltage $V_2$ may be rectified by rectifier 130 to provide an output DC voltage $V_{OUT}$, as illustrated in FIG. 1. As will be understood, the magnitude of $V_{OUT}$ may also be equal to, greater, or less than the magnitude of $V_{IN}$. In some DC-AC converter configurations such as circuit 100, DC isolation is provided between $V_{IN}$ and $V_{OUT}$, since there is no ground in common. Circuit 100 may be one of a plurality of DC—DC converter circuits situated physically near one another and each coupled to $V_{IN}$.

When oscillator 160 is not operating normally and fails to generate a suitable output frequency, switch 150 will not toggle back and forth sufficiently, and may cause damage to switches in switching means 150, to the power supply supplying $V_{IN}$, and/or to transformer 110, as explained above. For example, if oscillator 160 stops when switching means 150 is connecting terminal 101 to primary winding 111 and thus is connecting $V_{IN}$ across winding 111, winding 111 may effectively short circuit the input voltage source, thereby destroying winding 111 or causing other damage. Such damage may also occur if oscillator 160 does not completely stop but slows down so that $V_{IN}$ is connected across winding 111 for too long for a given cycle.

When oscillator 160 fails to generate an output frequency sufficient to prevent such damage from occurring, watchdog 170 overrides oscillator 160's control of switching means 150 and disables the switching means such that $V_{IN}$ is not harmfully applied to primary winding 111. In one embodiment, switching means 150 comprises one or more drive or switching transistors, whose outputs are connected to winding 111. In such an embodiment, when watchdog 170 detects that the output frequency of oscillator 160 is below a threshold frequency, watchdog 170 provides a signal to switching means 150 that causes the switching transistors' outputs to tristate. Alternatively stated, if a time out period occurs before the next oscillator signal transition is received, watchdog 170 tristates and thus disables switching means 150. As will be understood, when a longer time occurs between successive oscillator pulses or transitions, the frequency of the oscillator signal may be considered to have fallen.

In a further embodiment, if the output frequency of oscillator 160 again rises above the threshold frequency, then watchdog 170 removes its control of switching means 150, allowing it to switch as normal in accordance with the output frequency of oscillator 160. This function may be implemented by having watchdog 170 enable switching means 150 again as soon as another oscillator transition is received. Alternatively, watchdog 170 may perform this function by enabling the switching means if the output signal of oscillator 160 rises above the threshold frequency (or a second threshold frequency) for more than the time out period (or a second time out period).

As will be understood, in circuit 100 as illustrated in FIG. 1, switching means 150 disconnects and connects one terminal of voltage $V_{IN}$ so that winding 111 receives $V_{IN}$ or no voltage, alternately. As will be appreciated, however, in alternative preferred embodiments of the present invention, input voltage $V_{IN}$ may be applied by an appropriate switching means to winding 111 by reversing its polarity so that the voltage across winding 111 is either $V_{IN}$ or $-V_{IN}$. Further, although the embodiment illustrated in circuit 100 is not shown as using the center tap nodes of either winding 111 or 112, those skilled in the art will understand that the center tap or other tap nodes of either or both winding 111 or 112 may be utilized without departing from the principle and scope of the present invention. As will be appreciated, in any of these embodiments an input DC voltage $V_{IN}$ is connected and disconnected to a transformer at a certain frequency such that a square wave voltage is produced at the output of the transformer winding.

As will further be understood, in one embodiment oscillator circuit 160 generates a suitable periodic signal of a selectable or predetermined frequency, such as a square wave, which is used to control switching means 150. In other embodiments oscillator circuit may generate other types of signals, such as sawtooth waves or periodic pulses, where switching means 150 is configured to switch accordingly. For example, switching means 150 may be configured to switch with the peaks and/or troughs of sawtooth waves.

Figure 4:
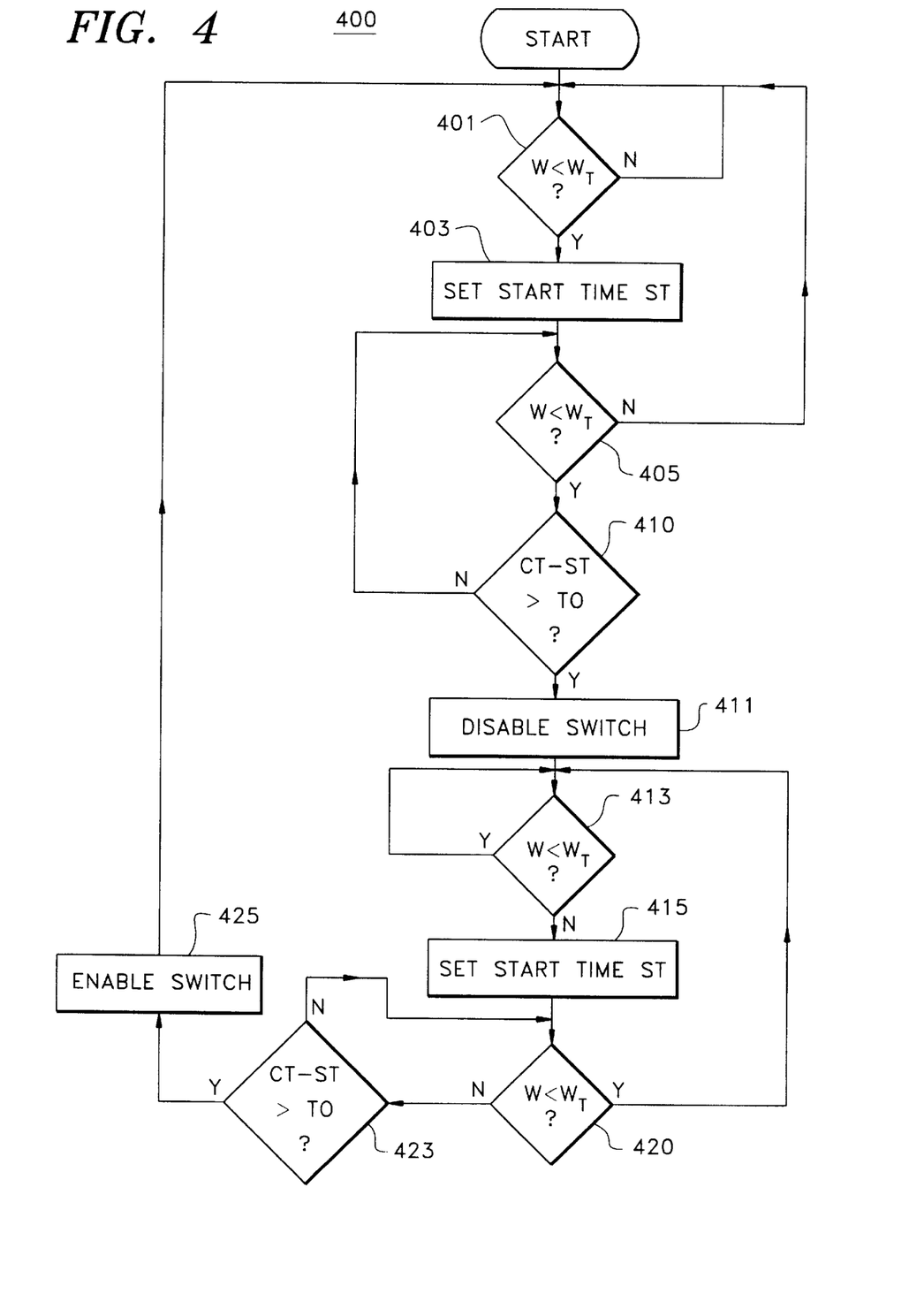
FIG. 4 is a flow chart of the method of operation of the DC-AC converter protection circuit of FIG. 1.

Referring now to FIG. 4, there is shown a flow chart 400 of the method of operation of an embodiment of circuit 100 of FIG. 1. Watchdog 170 monitors the frequency ω output by oscillator 160 (step 401 of FIG. 4). If measured frequency ω is above a threshold frequency $\omega_T$, watchdog 170 continues monitoring ω (step 401). Otherwise, a start time ST is set at the current time CT (step 403), and ω is again compared to $\omega_T$ (step 405). If ω is above $\omega_T$, then step 401 is returned to since ω has risen back above $\omega_T$ before the time out period has elapsed. If ω is still below $\omega_T$ (step 405), then if time out TO has elapsed since the start time ST (step 410), switching means 150 is disabled (step 411). Otherwise, if TO has not elapsed, step 405 is returned to.

Once switching means 150 has been disabled, watchdog 170 monitors frequency ω and enables switching means 150 if ω rises above $\omega_T$ for the time out period. As long as ω is below $\omega_T$, watchdog continues to monitor ω (step 413). If ω rises above $\omega_T$ (step 413), then a start time ST is set again (step 415), and if ω stays at or above $\omega_T$ for more than the time out TO (steps 420, 423), then switching means 150 is once again enabled (step 425) and watchdog 170 continues to monitor oscillator 160 for insufficient frequency output ω (steps 425, 401).

An alternative description of the operation of an embodiment of circuit 100 is as follows. Watchdog 170 monitors the oscillator signal output by oscillator 160, and resets a timer each time a negative transition occurs in the oscillator signal. If the timer reaches time out before another negative transition is received, switching means 150 is disabled, where the length of the time out period corresponds to the minimum acceptable oscillator frequency $\omega_T$. As soon as another negative transition occurs in the oscillator signal, switching means 150 is once again enabled and the timer of watchdog 170 is reset again. Thus, switching means 150 is disabled whenever the oscillator signal frequency is below $\omega_T$, or, equivalently, the switching means is disabled whenever the duration between oscillator signal transitions exceeds the cycle period corresponding to $\omega_T$.

Figure 5:
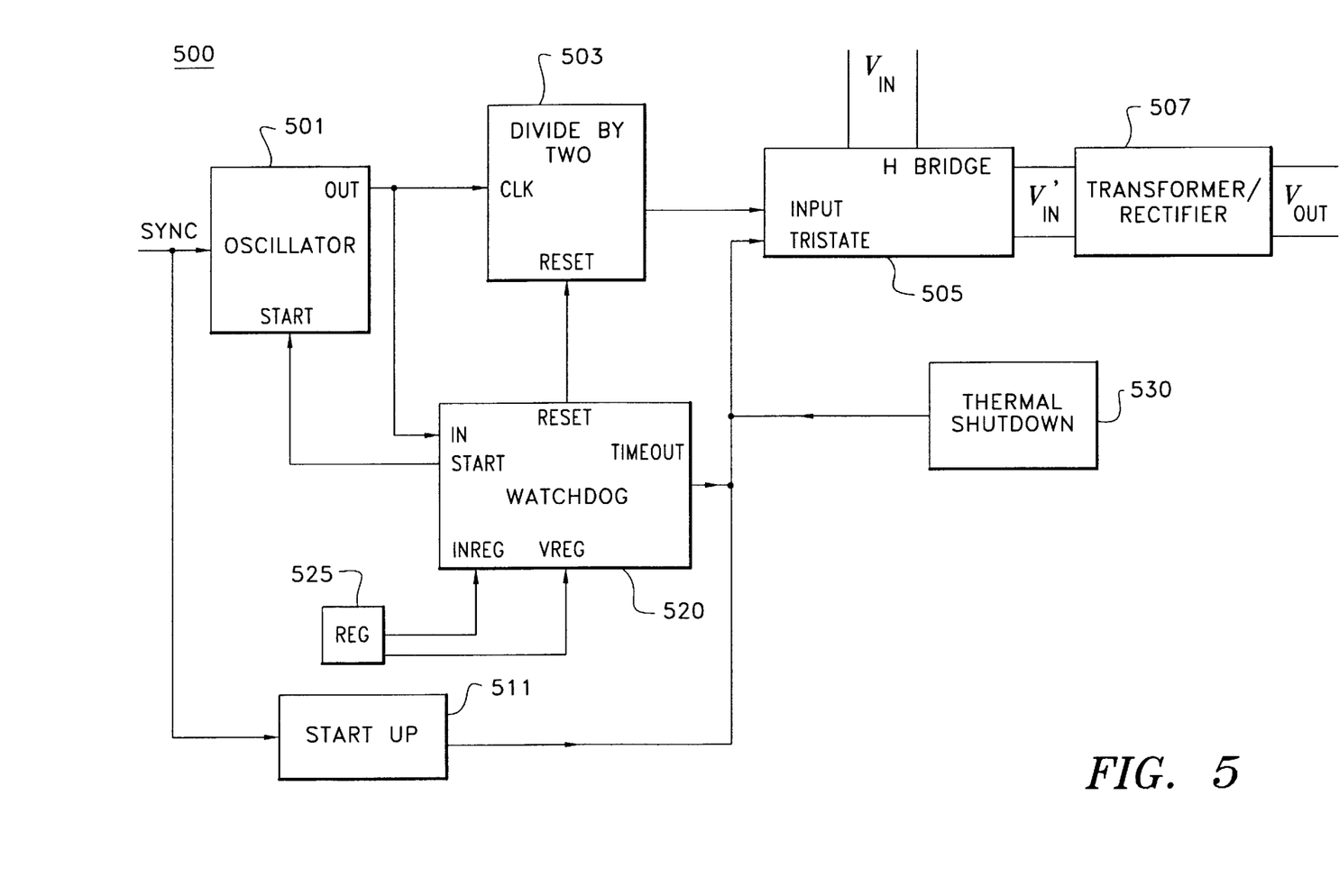
FIG. 5 is an alternative DC—DC converter circuit, having protection and synchronization circuitry according to a preferred embodiment of the present invention.

Referring now to FIG. 5, there is shown an alternative DC—DC converter circuit 500, having protection and synchronization circuitry according to a preferred embodiment of the present invention. As illustrated in FIG. 5, circuit 500 comprises oscillator 501, divide by two circuitry 503, watchdog 520, H bridge 505, transformer/rectifier 507, start up circuitry 511, voltage regulator 525, and thermal shutdown device 530. As will be appreciated, H bridge 505 receives an input DC voltage $V_{IN}$, which is switched in accordance with an oscillating frequency received at its input from divide by two circuit 503, to provide $V'_{IN}$, as illustrated. Input voltage $V_{IN}$ is switched across the primary winding of transformer/rectifier 507 to provide $V_{OUT}$, a DC voltage, as similarly described with respect to the DC—DC conversion of circuit 100 of FIG. 1. Voltage regulator (labeled "reg") 525, also known as a "bandgap" device, provides a regulated power supply voltage that may be used to drive circuitry components of circuit 500, such as oscillator 501, divide by two 503, and watchdog 520. Voltage regulator or bandgap 525 may provide a signal to the "inreg" pin of watchdog 520 that enables watchdog 520 once the supply voltage provided by the voltage regulator has stabilized and reached the desired level. In one embodiment, the supply voltage provided by voltage regulator 525 is 3.5 V.

H bridge 505 comprises at least one drive or switching transistor (not shown) that may be tristated in accordance with the signal appearing at the tristate input to the H bridge, as will be appreciated. When the drive transistors are tristated, $V_{IN}$ is no longer connected to transformer/rectifier 507, i.e. $V'_{IN}$ is zero. When the tristate input to H bridge 505 is not enabled, H bridge 505 switches $V_{IN}$ across the primary winding of transformer/rectifier 507 in accordance with the oscillating frequency received at its input from divide by two 503. As will be understood, in various embodiments $V_{IN}$ is switched across the primary winding of transformer/rectifier 507 by appropriate center-tap connection, in push-pull configuration, or by another suitable configuration.

Thermal shutdown 530 tristates the drive transistors of H bridge 505 when excess heat is detected. Thus, thermal shutdown serves as one means for protecting some or all of circuitry 500 when it is overheating for some reason, such as excess current flowing through a drive transistor of H bridge 505.

Oscillator 501 generates a periodic signal, such as a square wave, of frequency 2ω. This signal is coupled to divide by two 503 and also to watchdog 520, as illustrated. As previously described, in alternative embodiments the output of oscillator 501 may be a periodic signal other than a square wave, such as a sawtooth wave. Divide by two circuitry 503 outputs a periodic signal, such as a square wave, having frequency ω. As will be understood, one purpose of divide by two circuitry 503 may be to equalize the mark: space ratio of the periodic signal used to toggle H bridge 505. The sync or synchronization signal may be used to synchronize oscillator 501 with other converter circuits (not shown), and with start up circuitry 511 upon start up, as described in further detail below with reference to FIGS. 8–10.

Figure 6:
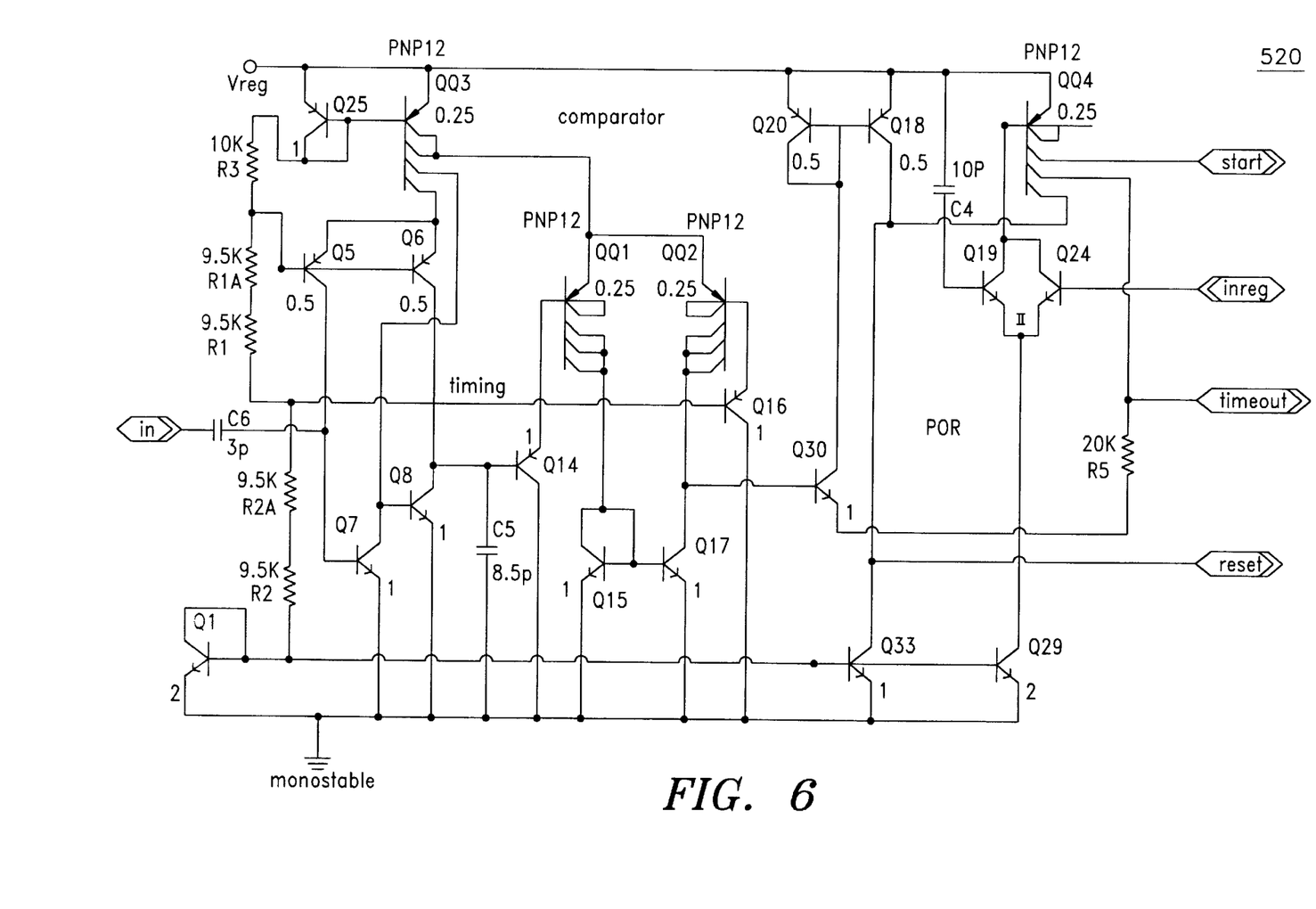
FIG. 6 illustrates the watchdog circuit of the circuit of FIG. 5 in further detail.

Referring now to FIG. 6, there is shown watchdog circuit 520 of circuit 500 of FIG. 5 in further detail. Watchdog 520 comprises pins labeled "in," "start," "inreg," "timeout," and "reset," and terminal "vreg," which is coupled to a suitable voltage source, preferably the regulated supply voltage generated by voltage regulator 525 of FIG. 5. Watchdog 520 further comprises a variety of interconnected elements including capacitors, transistors, and resistors. In particular, watchdog circuit 520 comprises resistors $R_3$, $R_{1A}$, $R_1$, $R_{2A}$, $R_2$, and $R_5$, with resistance in ohms as shown; for example, the resistance of resistor $R_3$ is 10 kΩ. Watchdog 520 further comprises capacitors $C_6$ (having a 3 pF capacitance, as shown), $C_5$, and $C_4$, and transistors $Q_{25}$, $QQ_3$, $Q_5$, $Q_6$, $Q_1$, $Q_7$, $Q_8$, $Q_{14}$, $QQ_1$, $QQ_2$, $Q_{15}$, $Q_{20}$, $Q_{18}$, $Q_{16}$, $Q_{30}$, $Q_{33}$, $Q_{29}$, $Q_{19}$, $Q_{24}$, and $QQ_4$. These circuit components of watchdog 520 are intercoupled as illustrated in FIG. 6. As will be appreciated, the numerical values shown near the collector or emitter of each transistor represent a relative transistor area figure. For example, the relative area of $Q_5$ is 0.5. As will further be appreciated, the notation "$QQ_x$" represents multiple transistors tied together in parallel. Thus, for example, $QQ_3$ comprises four pnp-type transistors, each having relative area 0.25, with their bases coupled together, their emitters coupled together, and with two of their collectors tied together and coupled to $QQ_1$, as illustrated, with the remaining collectors coupled to other components.

As will be appreciated, the function of the pins of watchdog 520 are as hereinafter described. The "in" pin receives the oscillator signal from oscillator 501 via line 502 (FIG. 5). The "reset" pin provides a signal that may be used to reset divide by two circuit 503 via line 504 whenever watchdog 520 detects that the time out period has elapsed since the last oscillator signal transition without another transition being received. When this occurs, watchdog 520 provides a signal on the "timeout" pin to tristate the switching transistors of H bridge 505. In one embodiment, the timeout pin is coupled to the bases of one or more npn switching transistors in H bridge 505 having grounded emitters. The inreg pin is for receiving a signal from voltage regulator or bandgap 525, as explained previously. As will be appreciated, the signal received on the inreg pin of watchdog 520 is low when the supply voltage provided by voltage regulator 525 is sufficient to operate watchdog 520 and other circuitry. The "start" pin may be used to keep oscillator 501 stopped, e.g. once watchdog 520 has disabled H bridge 505 due to the time out period elapsing, as described in further detail below.

Figure 7:
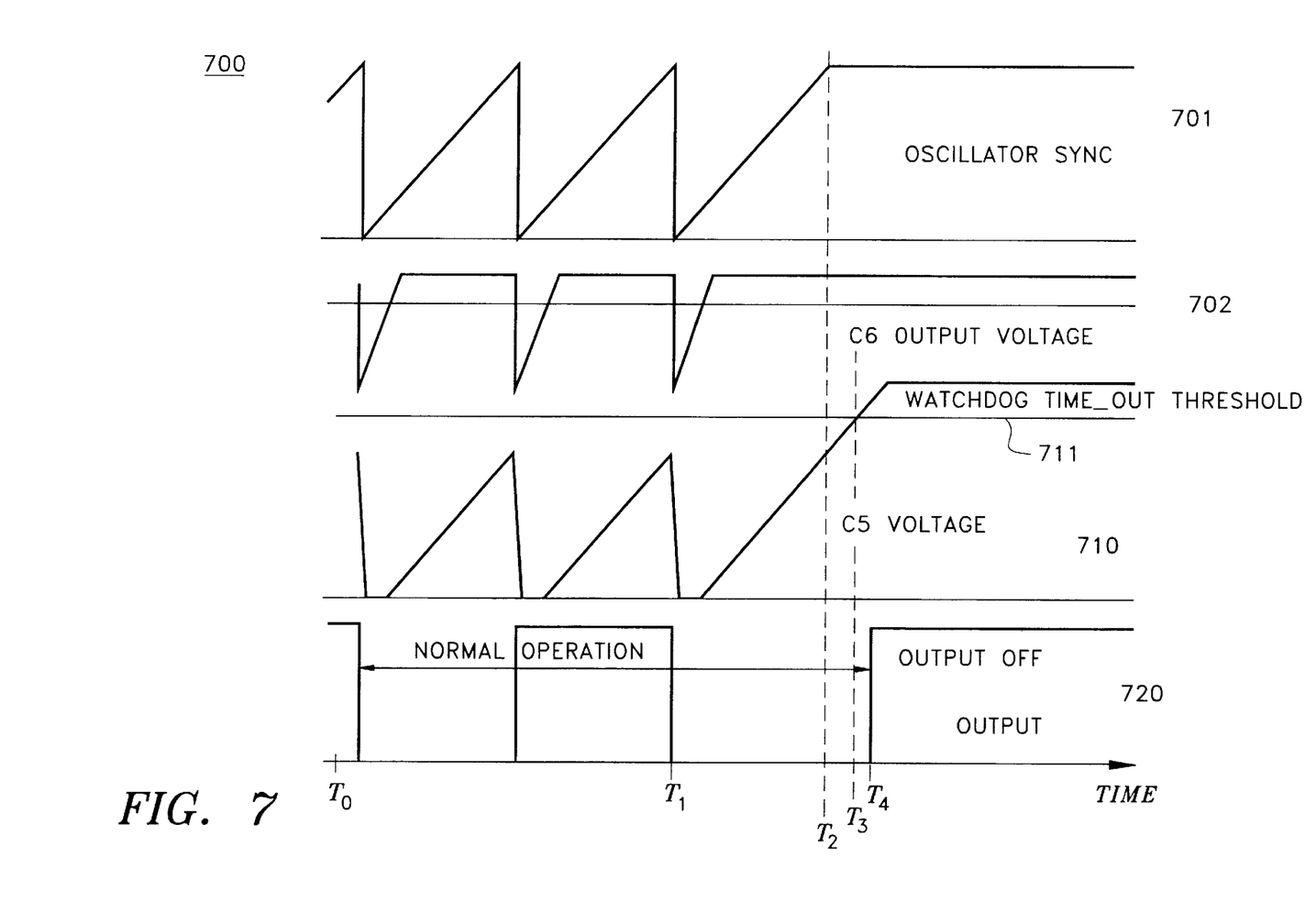
FIG. 7 is a timing diagram with exemplary waveforms of various signals illustrative of the operation of the watchdog circuit of FIG. 6.

Referring now to FIG. 7, there is shown timing diagram 700 showing exemplary waveforms of various signals, not necessarily to scale, illustrative of the operation of watchdog circuit 520. Diagram 700 comprises waveform 701, which shows the oscillator 501 sync; waveform 702, showing the voltage of the node of capacitor $C_6$ of watchdog 520 that is coupled to the base of transistor Q7; waveform 710, showing the voltage across capacitor $C_5$; and waveform 720, showing the state of the switching transistor of H bridge 505. For purposes of timing diagram 700 and waveform 720, it is assumed that H bridge 505 comprises a switching transistor (not shown) that is "low-side" coupled, i.e. that lies in series with the ground connection of the primary winding of the transformer of transformer/rectifier 507, while the top end of the primary winding is coupled to the input voltage $V_{IN}$. It is further assumed that the switching transistor cycles between "on" and "off" each time a negative transition is received from the signal provided by divide by two 503. Thus, for one cycle of the divide by two output signal, the bottom or "low" connection of the primary winding is coupled by the switching transistor to ground, so that $V_{IN}$ is applied to the primary winding; and for the next cycle the low side is open circuited so that $V_{IN}$ is not effectively coupled across the primary winding.

As illustrated in diagram 700, oscillator 501 sync is a sawtooth wave that ramps up and transitions down with a fast falling edge. As will be appreciated, the negative edge of the oscillator sync corresponds to a negative going edge of the oscillator's square wave signal output 502. The sawtooth wave of the oscillator sync is coupled to the in pin of watchdog 520.

Normal operation is illustrated in FIG. 7 roughly from time $T_0$ to $T_2$. As shown in waveform 701, at time $T_2$ the oscillator sync (and thus output 502) does not fall as it should. This may be caused by some problem with oscillator 501, or, for example, if oscillator 501 is intentionally stopped by pulling or keeping its sync pin high. By time $T_4$, watchdog 520 has disabled H bridge 505 since oscillator 520 has stopped for too long.

During normal operation, each negative edge of output 502 turns off $Q_7$ of watchdog 520, for the period set by the IC time constant of capacitor $C_6$ and the collector current of $Q_5$. This allows $Q_8$ to be momentarily turned on, which discharges $C_5$. Thus, these elements of watchdog circuit 520 function as an edge-triggered monostable. Capacitor $C_5$, which functions as a timing capacitor, is then charged by current source $Q_6$. Thus, after each negative edge of oscillator output 502, capacitor $C_5$ begins to charge up from a discharged state, at a constant rate, as shown by the upwardly-rising portions of waveform 710. Watchdog circuit 520 is configured so that if $C_5$ is not discharged again within a sufficient time period it will rise above a threshold voltage 711, thereby causing H bridge 505 to be disabled by tristating its switching transistor(s).

Thus, if no more oscillator pulses occur after the negative edge corresponding to time $T_1$ (or if another negative edge does not occur within a sufficient time), then the voltage of $C_5$ will being to rise after a short delay after $T_1$, causing the voltage sensed by voltage follower $Q_{14}$ to exceed the threshold voltage set by the $R_1$, $R_2$, $R_3$ combination at time $T_3$. As will be appreciated, time $T_3$ is after the time $T_2$ at which another negative edge of output 502 and the oscillator sync would occur if oscillator 501 were operating normally. $Q_{14}$ and the $R_1$, $R_2$, $R_3$ combination therefore help to form a voltage comparator. Exceeding this threshold voltage causes $QQ_1$ to be turned off and $QQ_2$ to be turned on, which in turn causes the base of $Q_{30}$ to go high, allowing current to flow therethrough to the timeout pin of watchdog 520 at $T_4$, a short time after $T_3$. This causes H bridge 505 to be disabled, as described previously, thus the "output off" labeled state of waveform 720. As will be understood by those skilled in the art, the IC time constant of $C_5$ and current source $Q_6$ is selected so that $C_5$ does not reach the turn off voltage of $Q_{14}$ before the next negative going edge of oscillator 501 output 502 discharges $C_5$ again. The current flowing through the collector of $Q_{30}$ is mirrored by the $Q_{20}$ $Q_{18}$ combination with sufficient current to overcome the $Q_{33}$ current source, thereby also causing the reset pin of watchdog 520 to go high. This resets divide by two circuit 503, as described previously.

As will be appreciated, the time between time $T_1$, and $T_2$ is a time period corresponding to a normal frequency. The time between time $T_1$, and $T_3$ is a time period corresponding to the previously mentioned threshold frequency $\omega_T$. Thus, the operation of watchdog 520 may be described as disabling H bridge 505 if it detects that the oscillator output 502 has not toggled for longer than a predetermined time out period (here defined as the time between $T_1$, and $T_3$), where the time out period is longer than the period of a normally-functioning oscillator output and preferably sufficient to allow the H bridge to be switched off in time to prevent damage to transformer/rectifier 507. This operation may also be described, as will be understood, as detecting whether the output frequency $2\omega$ of oscillator 501 is below a threshold frequency $\omega_T$.

As will further be appreciated, watchdog 520 comprises a frequency-to-voltage converter means whereby the voltage corresponding to the period of the oscillator signal (and thus inversely related to the oscillator signal frequency) will rise above a threshold voltage when the input signal's frequency falls below a corresponding threshold frequency, i.e. when another input signal transition is not received within a time out period.

During power on of watchdog circuit 520, the inreg pin is held high by voltage regulator 525, turning on $Q_{24}$, which turns on $QQ_4$, and prevents current from flowing through $Q_{19}$, so that the voltage across $C_4$ remains low. When voltage regulator 525 has reached its regulation supply voltage, the inreg pin goes low, allowing current to flow through $Q_{19}$ and keeping $QQ_4$ on. The base current of $Q_{19}$ charges up $C_4$ until $Q_{29}$ saturates, removing the current from $Q_{19}$ and thus turning off $QQ_4$. This power on reset, with circuit components having values as illustrated, takes approximately 100 μS, in one embodiment. The power on reset outputs ($QQ_4$ collectors) are hardwire OR'd to the reset pin and the timeout pin. The $QQ_4$ collectors also provide the start pin output signal used to hold oscillator 520 stopped, which can be useful when multiple oscillators are connected together, to cause them to start at the same time. Thus, as will be understood, while inreg is high, watchdog 520 holds the start pin high, which shorts the sync pin of oscillator 501 to ground; holds the timeout signal high, which disables H bridge 505; and holds the reset pin high, which resets divide by two circuit 503 and pulls its q output high.

Figure 8:
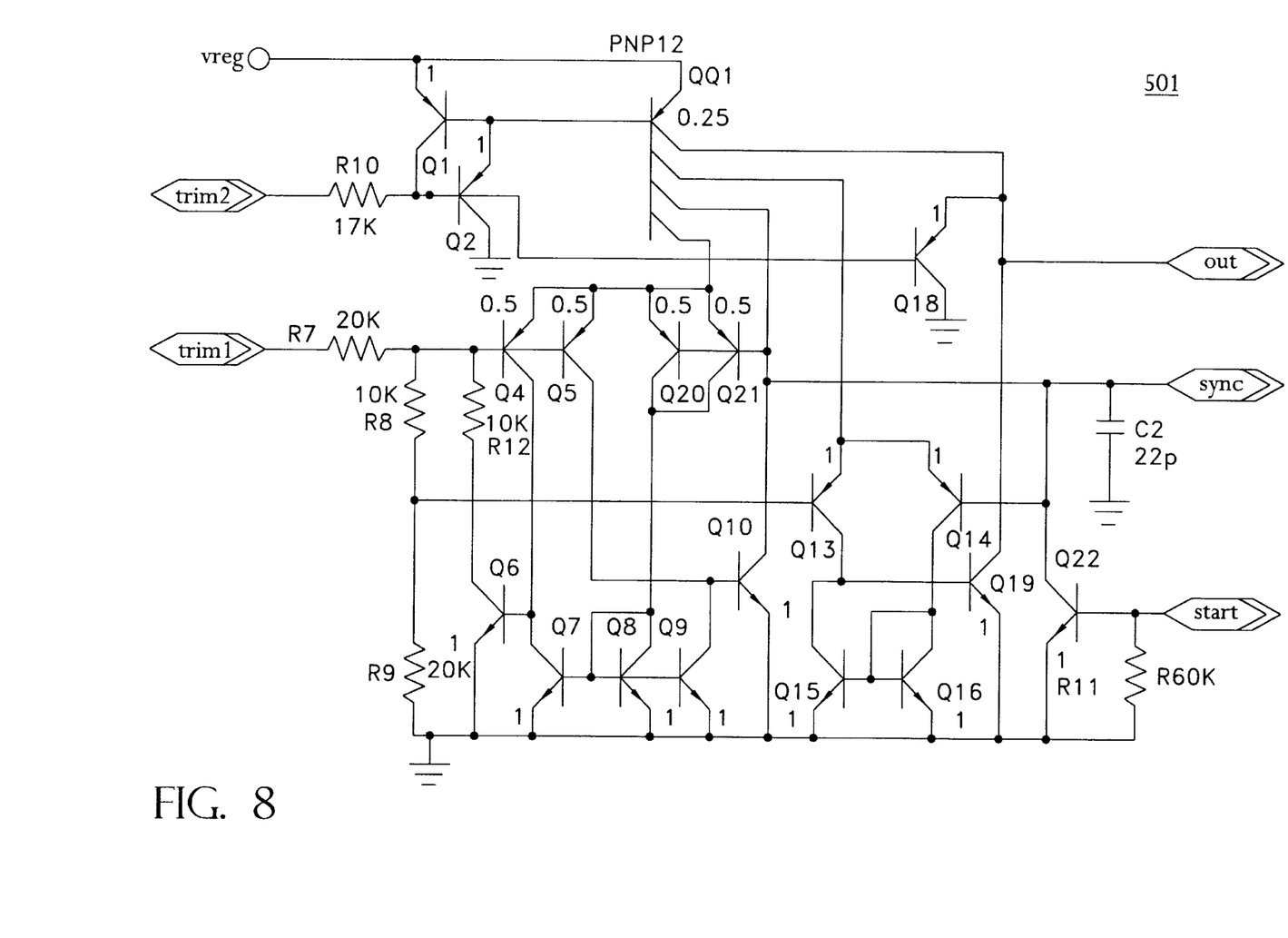
FIG. 8 illustrates the oscillator circuit of the circuit of FIG. 5 in further detail.
Figure 9:
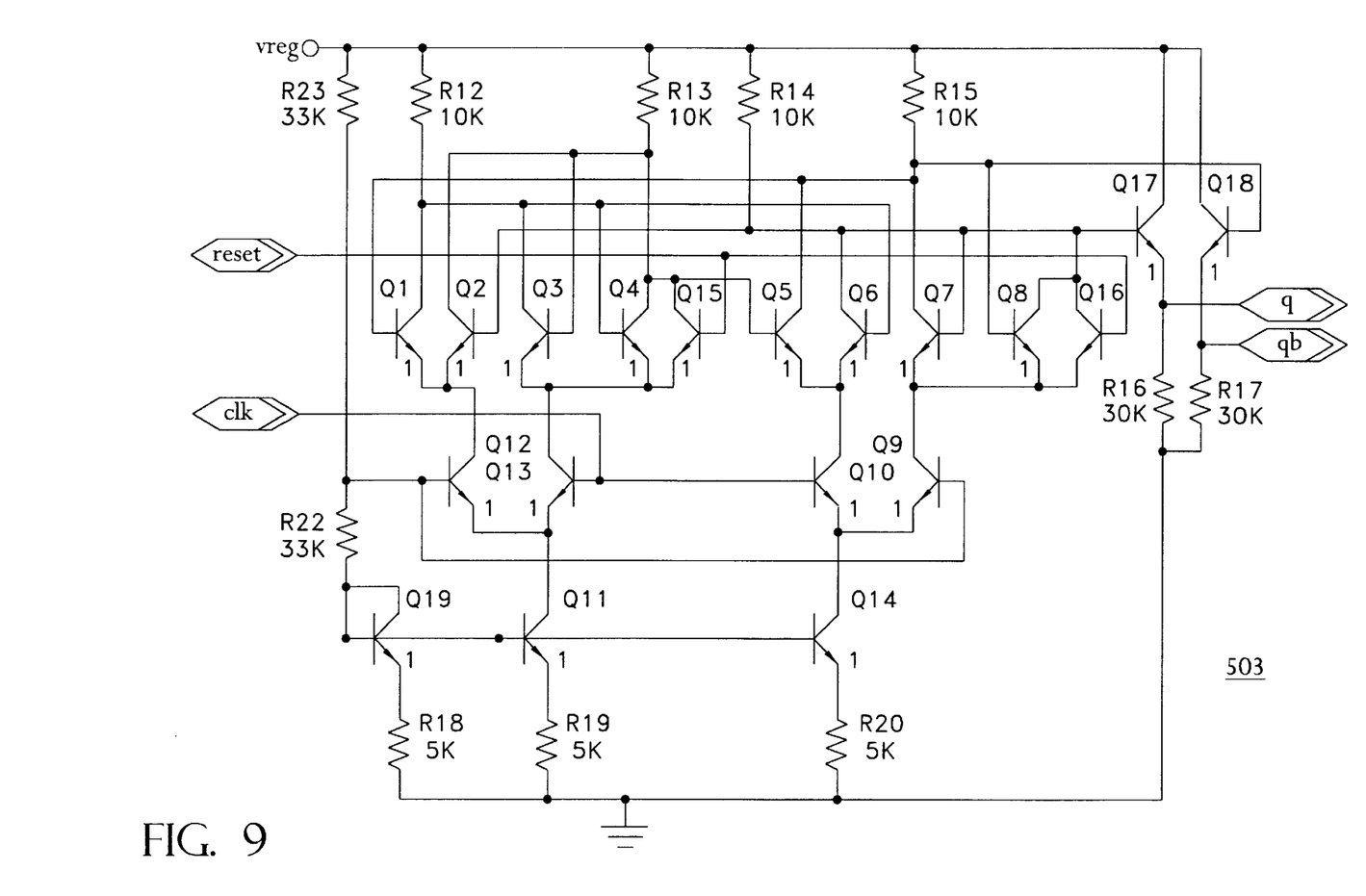
FIG. 9 illustrates the divide by two circuit of the circuit of FIG. 5 in further detail.

Referring now to FIG. 8, there is shown oscillator circuit 501 of circuit 500 of FIG. 5 in further detail. Referring to FIG. 9, FIG. 9 illustrates divide by two circuit 503 of circuit 500 of FIG. 5 in further detail. In a preferred embodiment of the present invention both oscillator 501 and divide by two 503 are synchronized as described hereinbelow. Referring once more to FIG. 8, oscillator circuit 501 comprises pins labeled "trim2," "trim1," "out," "sync," and "start," and terminal "vreg." Terminal vreg is coupled to the voltage supply of voltage regulator 525. Oscillator 501 further comprises a variety of interconnected elements including capacitors, transistors, and resistors. In particular, oscillator 501 comprises resistors $R_{10}$, $R_7$, $R_9$, $R_{12}$, and $R_{11}$, with resistance in ohms as shown; for example, the resistance of resistor $R_{10}$ is 17 kΩ. Oscillator 501 further comprises 22 pF capacitor C2 and transistors $Q_1$, $Q_2$, $Q_4$, $Q_5$, $Q_6$, $Q_7$, $Q_8$, $Q_9$, $Q_{10}$, $Q_{13}$, $Q_{14}$, $Q_{15}$, $Q_{16}$, $Q_{19}$, $Q_{18}$, $Q_{22}$, $Q_{21}$, $Q_{20}$, and $QQ_1$. These circuit components are intercoupled as illustrated in FIG. 8.

Referring once more to FIG. 9, divide by two circuit 503 comprises pins labeled "reset," "clk," "q," and "qb," and terminal "vreg." Terminal vreg is again coupled to the supply voltage provided by voltage regulator 525. Divide by two 503 further comprises a variety of interconnected elements including transistors and resistors. In particular, divide by two 503 comprises resistors $R_{23}$, $R_{12}$, $R_{23}$, $R_{14}$, $R_{15}$, $R_{22}$, $R_{18}$, $R_{19}$, $R_{20}$, $R_{16}$, and $R_{17}$, with resistance in ohms as show. Divide by two 503 further comprises transistors $Q_1$, $Q_2$, $Q_3$, $Q_4$, $Q_{15}$, $Q_5$, $Q_6$, $Q_7$, $Q_8$, $Q_{16}$, $Q_{17}$, $Q_{18}$, $Q_{12}$, $Q_{13}$, $Q_{10}$, $Q_9$, $Q_{19}$, $Q_{11}$, and $Q_{14}$. These circuit components are intercoupled as illustrated in FIG. 9.

In normal operation, after start up, oscillator 501 provides a periodic square wave signal of frequency 2ω on pin "out," which is fed in to clock pin "clk" of divide by two 503. Divide by two generates a periodic output signal of frequency ω on pin "q", as will be appreciated, and an inverse output signal "qb" (for q-bar, i.e. inverse q). In the present invention both oscillator 501 and divide by two 503 are started at a selected time and in a known state so that a plurality of such oscillators and divide by two circuits may be synchronized and started together, with each divide by two circuit of the plurality starting in the same, known state, as described in further detail with reference to FIG. 10.

Referring once more to FIG. 8, oscillator circuit 501 comprises transistors $Q_4$ to $Q_{10}$, $Q_{20}$ and $Q_{21}$, which form a schmitt comparator, the upper threshold for which is set by potential divider network $R_7$, $R_8$, and $R_9$. The negative input of the schmitt comparator (at $Q_{10}$) is coupled to $C_2$, which is charged by current source $QQ_1$. When the voltage across $C_2$ exceeds the upper threshold voltage of the schmitt comparator, transistor $Q_{10}$ conducts until the voltage falls below a lower threshold set by the comparator. This provides a sawtooth waveform on the sync pin, as illustrated in waveform 701 of FIG. 7, required for synchronization with other oscillators of other circuits (not shown) tied to the same sync pin.

Oscillator 501 also comprises transistors $Q_{13}$–$Q_{19}$, which form a comparator coupled in paralled with the schmitt comparator. This provides a square wave output signal at the out pin to drive watchdog circuit 520 and divide by two circuit 503.

When it is desired to start or restart oscillator circuit 501 and any other oscillator circuits to be synchronized therewith, for example during power on, each oscillator circuit 501 and its accompanying divide by two and watchdog circuitry is disabled until its respective voltage regulator 525 has reached the point where it can provide a stable supply voltage. Until this time, regulator 525 provides a high inreg signal, which causes watchdog 520 to issue high signals on its start, reset, and timeout pins, which disable the oscillator, divide by two, and H bridge, respectively. Further, a high start signal combined with tying together multiple oscillator sync pins serves to synchronize multiple oscillators, as described further below. A high reset signal holds the q output of divide by two 503 high, which causes each divide by two 503 to begin with its output q in a predictable (high) state once the start signal and reset signal drop to low to enable the oscillator and divide by two circuits, respectively.

As previously explained, at power on, voltage regulator 525 applies a high inreg signal to watchdog 520, until regulation is achieved. This causes watchdog 520 to apply a high signal to the start pin, turning on $Q_{22}$ which discharges $C_2$ (FIG. 6), and watchdog 520 issues high signals on its start, reset, and timeout pins, which disable oscillator 501, divide by two 503, and H bridge 505, respectively. The sync signal is held low until the power on reset is complete, since when the start signal is high the sync pin of oscillator 501 is shorted to ground (via $Q_{22}$ of FIG. 8). The sync signal is also hard wire coupled to any other sync lines of other oscillators to be synchronized with oscillator 501, which does not allow any sync signal to start to ramp up until the last one has its start signal changed from high to low. Thus, when multiple sync lines are coupled together in this manner, the oscillator circuit having the longest power on reset time will control. When these oscillator circuits are oscillating normally, one device (via $Q_{10}$ of FIG. 8) will take control and all other oscillators will synchronize, as described in further detail with reference to FIG. 10.

Referring once more to FIG. 9, divide by two 503 comprises a D-type flip-flop circuit and a reset input. When the sync line ceases to transition for more than the time out period, the reset output of watchdog 520 will go high, as explained above, resetting the D-type flip-flop ($Q_{15}$ and $Q_{16}$) and pulling the q output of divide by two 503 high. Also, at this point the timeout line of watchdog 520 goes high, which disables H bridge 505, as described hereinabove.

Figure 10:
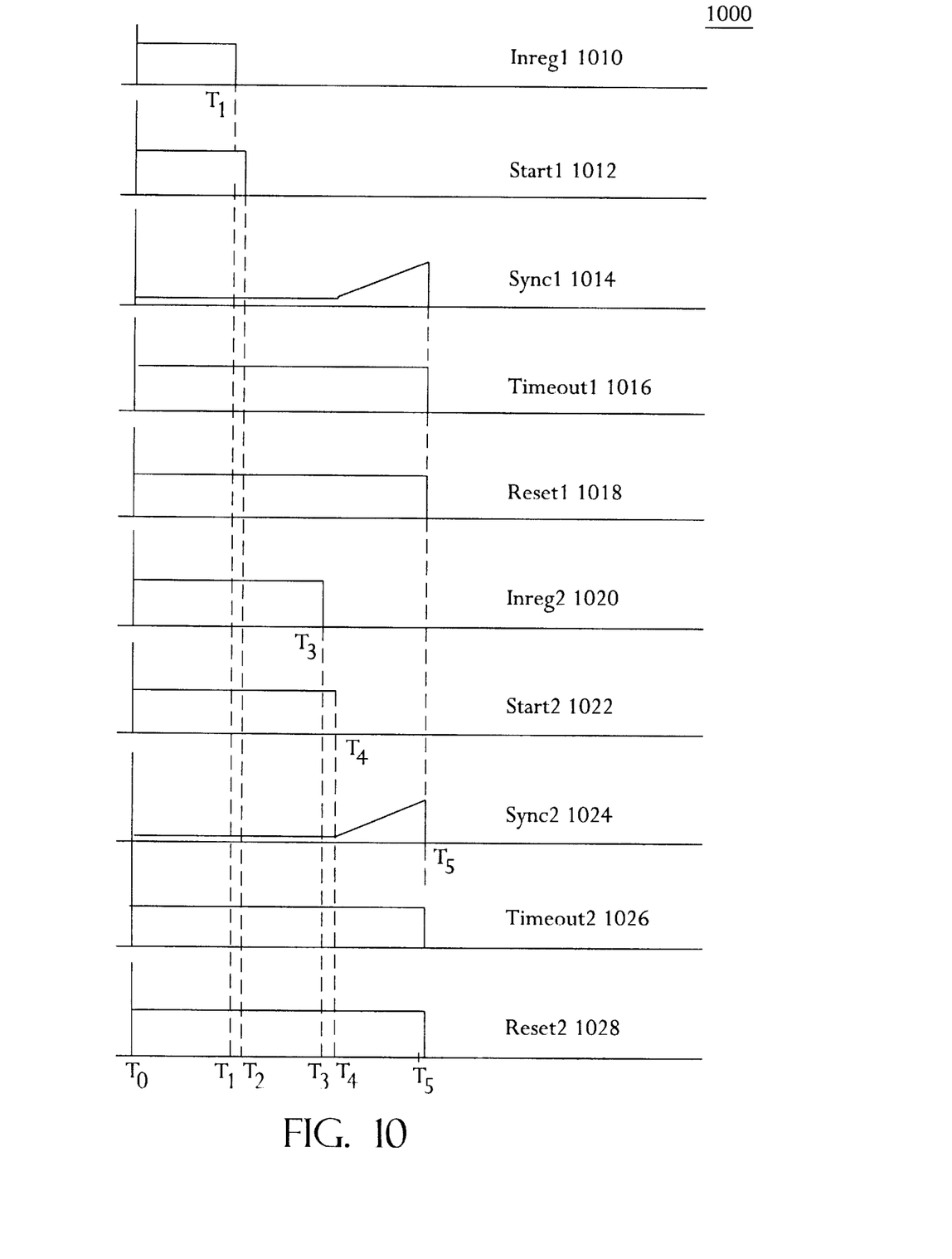
FIG. 10 is a second timing diagram with exemplary waveforms of various signals illustrative of the operation of the DC—DC converter circuit of FIG. 5.

Referring now to FIG. 10, there is shown is a timing diagram 1000 with exemplary waveforms of various signals illustrative of the operation of DC—DC converter circuit 500 of FIG. 5. Diagram 1000 shows the state of various signals of an oscillator 501 and watchdog 520 of two separate DC—DC converter circuits, each having components similar to those illustrated in FIG. 5, and having the sync pins of their oscillators hard wired together. Diagram 1000 comprises waveforms 1010, 1012, 1014, 1016, and 1018, which show the states of the inreg, start, sync, timeout, and reset signals, respectively, of the first circuit. These waveforms are thus labeled and referred to herein as inreg1, start1, sync1, timeout1, and reset1. Similarly, diagram 1000 comprises waveforms 1020, 1022, 1024, 1026, and 1028, which show the states of the inreg, start, sync, timeout, and reset signals, respectively, of the second circuit, which are labeled and referred to herein as inreg2, start2, sync2, timeout2, and reset2.

In the exemplary synchronization shown in FIG. 10, at some time before $T_0$ power is applied to each circuit's voltage regulator 525. Until each voltage regulator 525 is in regulation, its inreg signal, which is applied to its respective oscillator 520, is held high. In the illustrated example, regulator 525 of the first circuit reaches regulation at time $T_1$, before that of the second circuit, which does not reach regulation until a later time $T_3$. At time $T_1$, inreg1 thus transitions from high to low, as shown in waveform 1010. A short time later, $T_2$, start1 (waveform 1012) thus falls from high to low. Normally, this change in start1 would enable oscillator 501 of the first circuit so that its sync1 signal (waveform 1014) would begin rising. However, sync2 of the second circuit is hardwired to sync1, and sync2 cannot begin to rise until its own start2 signal changes from high to low, which will not occur until inreg2 has also fallen. Thus, sync1 remains low after $T_2$ even though start1 falls at $T_2$. Similarly, timeout1 and reset1, which will enable H bridge 505 and divide by two 503 of the first circuit, respectively, when they drop to low, remain high since they will not drop until sync1 first drops with the first clock signal (waveforms 1016, 1018).

At time $T_3$, voltage regulator 525 of the second circuit reaches regulation, and thus inreg2 transitions from high to low (waveform 1020). Thus, a short time later, at $T_4$, start2 falls, which enables oscillator 501 of the second circuit (waveform 1022). Thus, sync2 starts to rise at $T_4$ (waveform 1024), as does sync1 which is tied thereto (waveform 1014). Meanwhile, the divide by two circuits and H bridges of the two circuits continue to be disabled by their respective reset and timeout signals generated by the watchdog circuits, until the first synchronized negative going clock pulses are generated by the oscillators, at $T_5$. Additionally, while divide by twos 503 of both circuits are being held "reset" until this time, their outputs q are pulled and held high.

At $T_5$, both oscillators 501 simultaneously issue a downward going square wave transition on their out pins, which are fed to the clk pins of their respective divide by two circuits 503. At $T_5$ the timeout1 and reset1, and timeout2 and reset2, signals, transition from high to low, thus enabling, respectively, H bridge 505 and divide by two 503 of the first circuit, and H bridge 505 and divide by two 503 of the second circuit. As will be appreciated, since both divide by two circuits at this point become enabled while their q outputs are pulled high, they will begin in this state and at the next clock transition will change to low, and so on. Thus, in this way, multiple oscillator circuits 501 are synchronized, and their respective divide by two 503 stages are guaranteed to begin in a predictable and thus synchronized, rather than unpredictable and unsynchroriizable, state.

As will be appreciated by those skilled in the art, in alternative embodiments oscillator stages other than divide by two circuits may be beneficially synchronized in accordance with the present invention. For example, utilizing divide by eight circuits to follow oscillators may also cause the above-described unpredictability problems that may be addressed with the present invention.

As will be understood and as described above, the present invention can be embodied in the form of methods and apparatuses for practicing those methods. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments combine with the microprocessor to provide a unique device that operates analogous to specific logic circuits. For example, the function of watchdog 170 of circuit 100 of FIG. 1, as described in flowchart 400 of FIG. 4, may, in one embodiment, be implemented by a general-purpose or specially-designed microprocessor.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A method for generating signals with an apparatus; the apparatus comprising an oscillator means for generating a series of signals; an output means for transforming the series of signals into a second series of signals, a transformer; and a switching means for switching an input voltage across a first winding of the transformer in accordance with the second series of signals; the method comprising the steps of:

(a) providing a control signal to the output means to hold the output means in a selected state;

(b) changing the control signal to enable the output means in the selected state when the oscillator means generates a first signal of the series of signals; and (c) providing a switching control signal to the switching means to disable the switching means until the oscillator means generates the first signal.

2. The method of claim 1, wherein:

the apparatus further comprises a voltage supply regulator means for providing a watchdog control signal that disables a watchdog means until the voltage supply regulator means is generating a regulated supply voltage;

the control signal is generated with the watchdog means;

the oscillator means comprises a sync signal generator means for providing a sync signal at a sync signal output, wherein, when the sync signal generator is enabled, the sync signal increases and transitions from high to low after reaching a predetermined threshold; and each signal of the series of signals is a high to low transition that transitions when the sync signal transitions from high to low;

the method further comprising the step of providing, with the watchdog means, a start signal to enable the sync signal generator means when the watchdog means is enabled.

3. The method of claim 2, wherein, when the sync signal output is coupled to a second sync signal output of a second circuit having a second sync signal generator means, the sync signal and the second sync signal cannot begin to increase until both the sync signal generator means and the second sync signal generator means have been enabled.

4. The method of claim 1, wherein:

the series of signals has a frequency; and the output means is a divide means for dividing the frequency by a factor.

5. The method of claim 1, wherein:

the series of signals has a frequency; and the output means is a divide by two means for dividing the frequency by two.

6. The method of claim 1, wherein the selected state is high.

7. An apparatus for generating signals, comprising:

(a) an oscillator means for generating a series of signals;

(b) an output means for transforming the series of signals into a second series of signals;

(c) a watchdog means for providing a control signal to the output means to hold the output means in a selected state and for changing the control signal to enable the output means in the selected state when the oscillator means generates a first signal of the series of signals;

(d) a transformer; and (e) a switching means for switching an input voltage across a first winding of the transformer in accordance with the second series of signals; wherein:

the watchdog means provides a switching control signal to the switching means to disable the switching means until the oscillator means generates the first signal.

8. The apparatus of claim 7, further comprising a voltage supply regulator means for providing a watchdog control signal that disables the watchdog means until the voltage supply regulator means is generating a regulated supply voltage; wherein:

the oscillator means comprises a sync signal generator means for providing a sync signal at a sync signal output, wherein, when the sync signal generator is enabled, the sync signal increases and transitions from high to low after reaching a predetermined threshold;

each signal of the series of signals is a high to low transition that transitions when the sync signal transitions from high to low; and the watchdog means provides a start signal to enable the sync signal generator means when the watchdog means is enabled.

9. The apparatus of claim 7, wherein, when the sync signal output is coupled to a second sync signal output of a second circuit having a second sync signal generator means, the sync signal and the second sync signal cannot begin to increase until both the sync signal generator means and the second sync signal generator means have been enabled.

10. The apparatus of claim 7, wherein:

the series of signals has a frequency; and the output means is a divide means for dividing the frequency by a factor.

11. The apparatus of claim 7, wherein:

the series of signals has a frequency; and the output means is a divide by two means for dividing the frequency by two.

12. The apparatus of claim 7, wherein the selected state is high.

* * * * *